US011490473B2

(12) United States Patent
Gross

(10) Patent No.: US 11,490,473 B2
(45) Date of Patent: Nov. 1, 2022

(54) METHOD AND APPARATUS FOR THE THERMAL TREATMENT OF A SUBSTRATE

(71) Applicants: Leander Kilian Gross, Langebrück (DE); Mascha Elly Gross, Langebrück (DE)

(72) Inventor: Harald Gross, Langebrück (DE)

(73) Assignees: Leander Kilian Gross, Langebrück (DE); Mascha Elly Gross, Langebrück (DE)

( * ) Notice: Subject to any disclaimer, the term of this patent is extended or adjusted under 35 U.S.C. 154(b) by 901 days.

(21) Appl. No.: 16/309,639

(22) PCT Filed: Jun. 14, 2017

(86) PCT No.: PCT/EP2017/064616
§ 371 (c)(1),
(2) Date: Dec. 13, 2018

(87) PCT Pub. No.: WO2017/216262
PCT Pub. Date: Dec. 21, 2017

(65) Prior Publication Data
US 2019/0208609 A1    Jul. 4, 2019

(30) Foreign Application Priority Data

Jun. 14, 2016 (DE) .......................... 102016110867.7
Jul. 13, 2016 (DE) .......................... 102016112836.8

(51) Int. Cl.
*H05B 41/32* (2006.01)
*H01J 37/32* (2006.01)
(Continued)

(52) U.S. Cl.
CPC .............. *H05B 41/32* (2013.01); *H01J 37/32* (2013.01); *H01J 37/32018* (2013.01);
(Continued)

(58) Field of Classification Search
None
See application file for complete search history.

(56) References Cited

U.S. PATENT DOCUMENTS 3,130,359 A * 4/1964 Sherwood ................. H02J 7/12
320/162
4,325,008 A     4/1982 Borland
(Continued)

OTHER PUBLICATIONS

International Preliminary Report on Patentability (and English translation) for International Application No. PCT/EP2017/064616 dated Dec. 18, 2018.
(Continued)

*Primary Examiner* — Vibol Tan
(74) *Attorney, Agent, or Firm* — Heslin Rothenberg Farley & Mesiti P.C.; Kevin P. Radigan, Esq.

(57) ABSTRACT

In an apparatus for thermal treatment of substrates, a gas discharge lamp runs in a simmer mode in standby operation. A constant power supply may be connected to the gas discharge lamp via a first switch. At least one charged capacitor may be connected to the gas discharge lamp via a second switch. A thermal treatment of the end side of a substrate with a duration of between 20 milliseconds and 500 milliseconds is provided in a manner governed by light absorption. This time window is advantageous for thermal treatment of coatings having a thickness of 2 to 200 micrometers, wherein the temperature of the rear side of the substrate can remain below that of the end side. The temperature on the end side can be significantly increased by the gas discharge lamp being connected to the capacitor via the second switch at the end of the time window.

8 Claims, 3 Drawing Sheets

(51) Int. Cl.
*H01L 21/67* (2006.01)
*H01J 61/56* (2006.01)

(52) U.S. Cl.
CPC ........ *H01J 37/32045* (2013.01); *H01J 61/56* (2013.01); *H01L 21/67115* (2013.01)

(56) References Cited

U.S. PATENT DOCUMENTS

| | | | | |
|---|---|---|---|---|
| 10,347,512 | B2* | 7/2019 | Tanimura | H01L 21/67115 |
| 2008/0033413 | A1* | 2/2008 | Inochkin | H05B 41/30 |
| | | | | 606/11 |
| 2009/0274833 | A1* | 11/2009 | Li | C09D 11/037 |
| | | | | 427/123 |
| 2010/0098874 | A1 | 4/2010 | Schroder | |
| 2010/0111513 | A1* | 5/2010 | Nishihara | H01L 21/2686 |
| | | | | 392/418 |
| 2011/0101778 | A1* | 5/2011 | Yang | H02J 7/0068 |
| | | | | 307/52 |
| 2011/0254447 | A1* | 10/2011 | Okamoto | H01J 61/90 |
| | | | | 315/84.51 |
| 2013/0043221 | A1 | 2/2013 | Hathaway et al. | |
| 2013/0099693 | A1* | 4/2013 | Karim | H05B 41/32 |
| | | | | 315/224 |
| 2015/0181714 | A1* | 6/2015 | Ahmed | H05B 41/34 |
| | | | | 427/444 |

OTHER PUBLICATIONS

International Search Report issued in PCT/EP2017/064616 dated Jul. 31, 2017.
Shengqiang Zhou, "Hyperdoping silicon with selenium: solid vs. liquid phase epitaxy," Scientific Reports, 5:8329 (2015).

* cited by examiner

Literaturstelle: Zhou, S. et al. Hyperdoping silicon with selenium: solid vs. liquid phase epitaxy. Sci. Rep. 5, 8329; DOI:10.1038/srep08329 (2015)

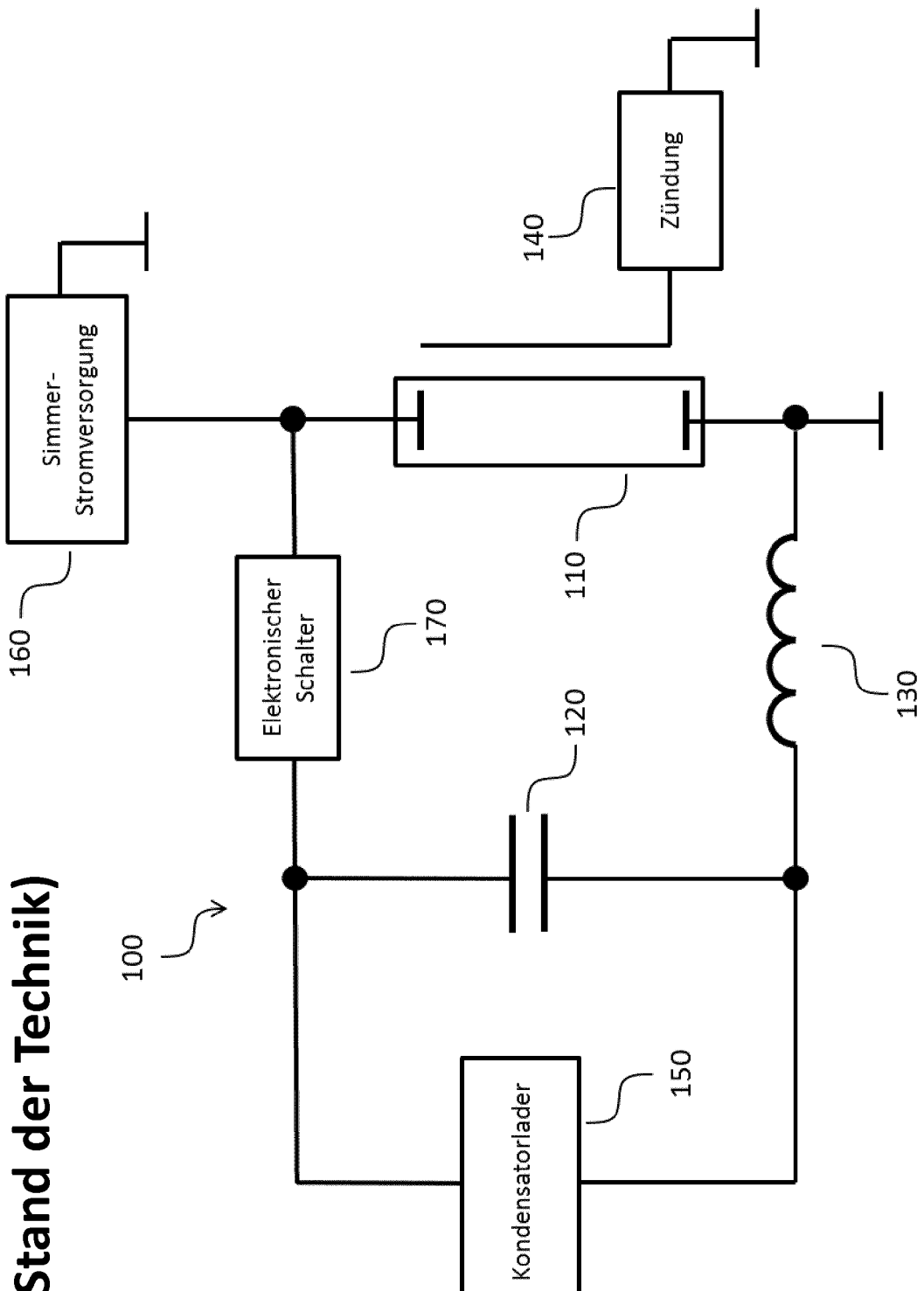
Fig. 2 (Stand der Technik)

METHOD AND APPARATUS FOR THE THERMAL TREATMENT OF A SUBSTRATE

CROSS REFERENCE TO RELATED APPLICATIONS

This application is the National Phase filing under 35 U.S.C. § 371 of International Application No.: PCT/EP2017/064616, filed on Jun. 14, 2017, and published on Dec. 21, 2017 as WO 2017/216262 A1, and claims priority to German Application No.: 10 2016 110 867.7, filed on Jun. 14, 2016, and to German Application No.: 10 2016 112 836.8, filed on Jul. 13, 2016. The contents of each of the prior applications are hereby incorporated by reference herein in their entirety.

BACKGROUND ART

The invention relates to a method and an apparatus for the brief thermal treatment of a substrate by means of at least one gas discharge lamp. The method is applied in greatly varying fields of industry, for example, in semiconductor production, the fabrication of photovoltaic modules, or display screen production. Novel areas of application include, inter alia, printed electronics or coatings of surfaces with nanoparticles. Because of the short duration of the thermal treatment, for example, diffusion processes are minimized and heating and/or cooling lines are avoided, as are routine in furnaces in continuous industrial facilities.

FIG. 1 shows the chronological duration of the thermal treatment of various methods for doping a semiconductor. These include thermal treatment using flash lamps (FLA=flash lamp annealing), using halogen and/or infrared lamps (RTA=rapid thermal annealing), and thermal treatment in furnaces (FA=furnace annealing).

However, it has been shown, in experiments and thermal simulations that one or another method or a combination thereof is suitable for the thermal treatment, depending on the application. For example, in so-called "photonic curing", in a first process step, a copper-containing ink is printed on a plastic film, in a second process step, it is dried by means of an infrared radiator at a temperature of approximately 120° C. within approximately one second, and in a third process step, it is sintered with the aid of flash lamps at greater than 800° C. for 1 ms. The sintering process cannot be carried out using infrared radiators or in a conventional furnace because of the maximum operating temperature of the plastic. In contrast, the drying process requires a certain time, inter alia, in dependence on the thickness of the film, until the solvents contained in the printed ink have evaporated. This drying time is greater by one to multiple orders of magnitude than the pulse duration of flash lamps possible in practice. In principle, in continuous plants, the duration of action of the infrared radiator or the halogen lamp, respectively, on the substrate could also be set in the range of 1 ms by a high relative speed in relation to one another. However, the maximum possible powers of infrared radiators or halogen lamps are multiple orders of magnitude below the powers required for the rapid temperature increase to 800° C.

In the semiconductor industry, RTA with the aid of halogen lamps, for example, to activate dopants after the implantation or to oxidize surfaces in oxygen, is a fixed component in production. To be able to achieve higher temperatures on the substrate surface, in some cases flash lamps are used in addition to the halogen lamps. After the complete heating of an entire wafer having semiconductors within, for example, one to a few seconds to 900° C. with the aid of halogen lamps, a thermal treatment using flash lamps takes place directly thereafter, to briefly achieve a maximum surface temperature of approximately 1300° C. Complete heating by the halogen lamps means a negligible temperature gradient within the entire wafer. The additional temperature increase induced by the flash lamps, in contrast, only affects the first few micrometers of the side of the wafer illuminated by the flash lamps. The combination of halogen lamps and flash lamps is also referred to as "flash lamp assisted spike annealing". A duration of action of temperatures in the range of 1300° C. longer than that caused using flash lamps would have disadvantageous effects on the diffusion profiles of a pn-transition in a transistor. Heating the wafer from room temperature to 1300° C. by flash lamps alone would not only result in excessively high temperature gradients and thermomechanical tension linked thereto up to the shattering of the wafer, but rather the powers required for this purpose are close to or even above the explosion limit of flash lamps, depending on the embodiment.

As can be seen in FIG. 1, there is a time gap with respect to the thermal treatment between FLA and RTA. This gap relates, inter alia, to coatings on substrates which have a thickness of approximately 2 up to approximately 200 µm. These include, for example, sol-gel films having nanoparticles or lacquers. Finding a method which generates lesser temperature gradients inside the substrate according to the "flash lamp assisted spike annealing", but at the same time the rear side of the substrate remains at room temperature, is also of great interest. Ideally, this method should manage using a single type instead of multiple energy sources. For reasons of space, in flash lamp assisted spike annealing, the halogen lamps are typically arranged to irradiate the rear side of the wafer and the flash lamps to irradiate the front side, on which the transistors are located. This special arrangement is only possible because of the complete heating of the wafer by the halogen lamps. However, if complete heating of the substrate for the thermal treatment has to be avoided, i.e., the rear side of the substrate cannot exceed a specific temperature, both energy sources can thus only be arranged on the front side. This is not always possible, inter alia, for reasons of space or restrictions with respect to the light optical unit.

A further disadvantage of the halogen lamps or infrared lamps is the relatively long switching-on or switching-off time. For example, it takes approximately one half a second until the incandescent coil of the halogen lamps are heated up to the full radiant power when they are switched on. In the case of flash lamps, in contrast, the switching-on-time can be in the range from one to a few microseconds. For the method according to the invention, the switching-on and switching-off times for the energy source are to be shorter than 10% of the total exposure duration. This is ideally as short as in the case of flash lamps, which are in the range of a few microseconds.

In principle, lasers could be used for the time gap between FLA and RTP sketched in FIG. 1. However, neglecting substantially higher costs for the production and the operation of lasers in relation to the above-mentioned energy sources, the throughput achievable in production is much too low in most cases. The use of multiple lasers to increase the throughput is not feasible, inter alia, for reasons of cost, in particular since the lasers have to be coordinated with one another. In addition, different temperature profiles result by way of lasers because of their punctiform action and the temperature profiles resulting therefrom on the substrate in contrast to the planar action of fields of flash lamps or halogen lamps and/or infrared radiators arranged in parallel. The different temperature profiles can entail different effects on the result of the thermal treatment of the substrate.

FIG. 2 shows the prior art of an apparatus (100), which is typical for operating flash lamps in production. In principle, a circuit consists of a flash lamp (110), a capacitor (120) as an energy source, and a throttle coil (130) for current limiting. A separate power supply (140) is necessary for the ignition of the flash lamp, which is embodied in the figure as so-called "external ignition". An external ignition consists, for example, of an optical reflector made of metal, which is arranged around the flash lamp and is electrically connected to the power supply of the ignition. Other ignition variants are also used in dependence on the application of the flash lamps.

It has been shown during the use of flash lamps for the optical pumping of lasers that the service life of the flash lamps can be lengthened if they are operated in standby mode by a so-called simmer power supply. Simmers are power supplies which keep a thin plasma thread burning in the flash lamp similar to an ignition spark. For example, the simmer current through the flash lamp is 0.5 A after the ignition of the flash lamp. To switch over into the actual operating mode of the flash lamp, the capacitor (120) has to be previously charged by a power supply (150). Subsequently, the capacitor (120) is discharged via the flash lamp (110) via an electronic switch (170). The current in the operating mode can be several hundred up to several thousand amps, depending on the embodiment and desired light intensity of the flash lamp. The pulse duration of the discharge in the operating mode of the flash lamps is typically between 50 µs and 20 ms, wherein the current through the flash lamp assumes the shape of a Gaussian function with respect to time. The discharge procedure of the capacitor can be stopped in this case by the electronic switch (170) at an arbitrary point in time.

SUMMARY OF THE INVENTION

The current invention provides a method for thermal treatment of a substrate using at least one gas discharge lamp, wherein the gas discharge lamp is operated for a first period of time having a duration of 20 ms to 5 seconds at a constant electrical power, and, at the end of the first period of time, the average electrical power of the gas discharge lamp is increased by at least one order of magnitude for a second period of time having a duration of 50 µs to 20 ms.

The thermal treatment of the substrate in the first period of time may remain restricted from 20 ms to 5 seconds, and the substrate may have a coating having a thickness of 2 to 200 µm. The coating may comprise at least one sol-gel film, a lacquer, or nanoparticles.

The current invention also provides an apparatus for thermal treatment of a substrate using at least one gas discharge lamp, which has a simmer operation in a standby mode, wherein the gas discharge lamp can be connected via a first electronic switch to a first power supply of constant power for a freely selectable period of time having a duration of greater than 50 µs and can be connected via a second electronic switch to at least one electrically charged capacitor.

The first power supply may include a stray field transformer and a rectifier, and a maximum current strength of the stray field transformer may be set manually via a mechanical regulator. The first power supply may include at least one rechargeable battery.

BRIEF DESCRIPTION OF THE DRAWING FIGURES

DETAILED DESCRIPTION

Figure 3:
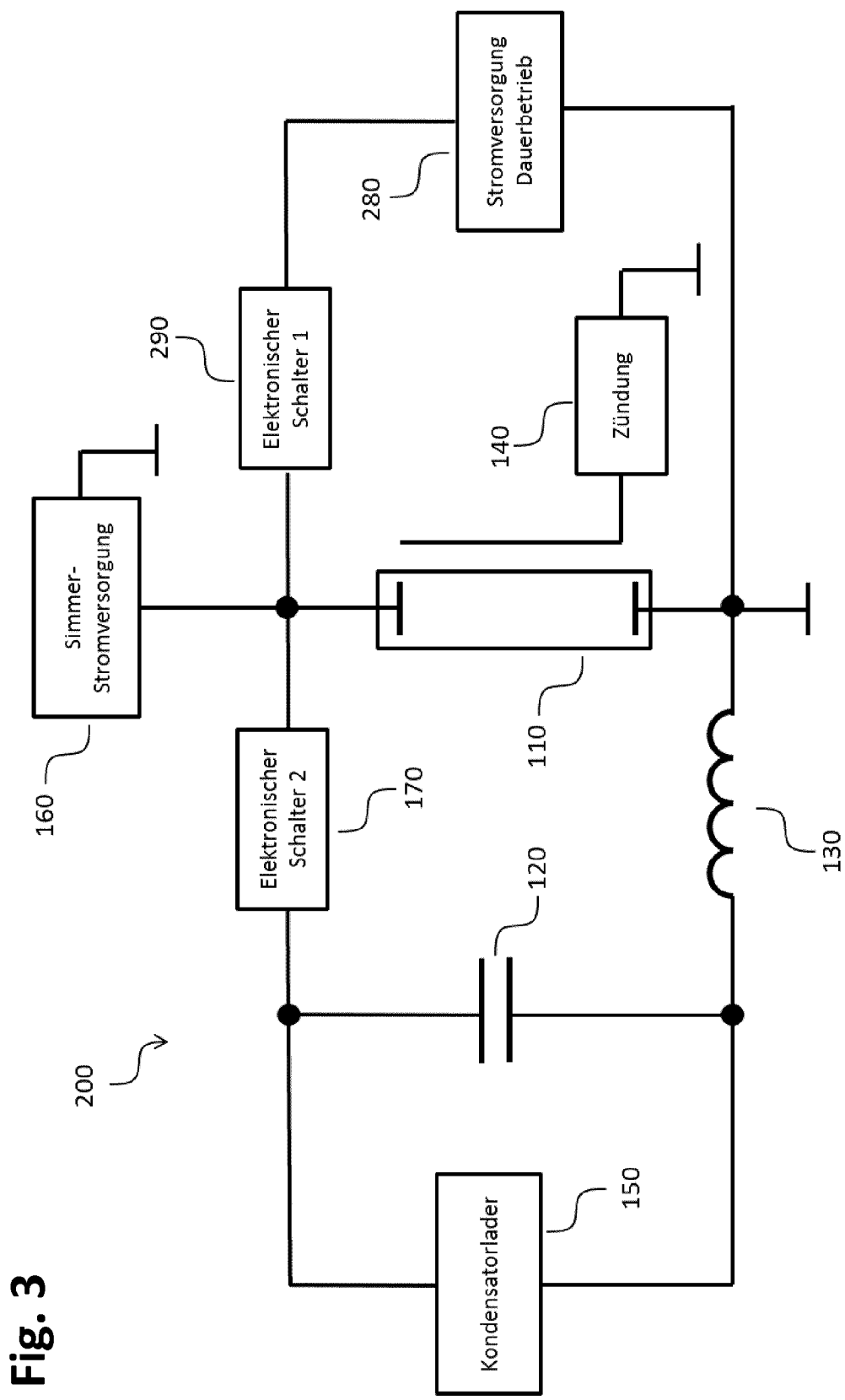
FIG. 3 illustrates apparatus for thermal treatment of a substrate, in accordance with the present invention.

FIG. 3 shows an expansion in relation to the apparatus (100) according to the invention, which consists of an additional electronic switch 1 (290) and an additional power supply (280). The power supply (280) can be a stray field transformer in the simplest construction, which is conceived for a sufficiently high no-load voltage in dependence on the arc length of the flash lamp (110) and has a manually and mechanically settable short-circuit current. Manually and mechanically settable stray field transformers are also used for the electrical welding of metals. The output of the transformer is connected via a rectifier to the electronic switch and the ground line. Typical output currents for the power supply (280) are 10 to 100 A. In contrast to the capacitor (120), the stray field transformer supplies a constant current, so that the flash lamp (110) can be operated as a continuously burning gas discharge lamp, but with a power less than the capacitor (120) by one to multiple orders of magnitude and/or corresponding to the strength of the current through the flash lamp. Alternative power supplies to a stray field transformer, for example, switching power supplies, are also suitable.

To avoid brief and very high power demands on the public power network for the power supply (280), rechargeable batteries can be used as buffers. For example, a voltage in the range of several hundred to several thousand volts can be generated at currents greater than 1000 A by a series circuit of many rechargeable batteries, which are used for starting an automobile. The chemical reaction time of the rechargeable battery is typically in the range of a few microseconds, so that exposure times in the time range of 1 ms to multiple seconds can be implemented without problems. The rechargeable batteries are charged during a continuous power withdrawal from the public network between two successive exposures, which have a time interval of, for example, 30 seconds.

The lamp (110) can be switched on and off equally fast using the electronic switch 1 (290) as using the electronic switch 2 (170), so that the exposure time can be set nearly arbitrarily short without significant delays during the switching-on or switching-off procedure, as is the case with halogen lamps or infrared lamps.

One important and limiting factor is the cooling of the lamp, for example, using air or water. The quartz glass or the flash lamp or the electrodes of the flash lamp, which primarily consist of tungsten, cannot melt at any point in time. However, currents, which are far above the maximum currents in continuous operation, can be set briefly for the thermal treatment of a substrate for a duration of, for example, 500 ms, similarly as in flash lamps.

Both electronic switches (170), (290) can in principle be closed or opened at any arbitrary point in time and independently of one another. However, only the following three variants are practice-relevant for a thermal treatment of a substrate: a) exclusively the electronic switch 1 (290) is closed for a desired length of time and subsequently opened again, b) exclusively the electronic switch 2 (170) is closed, wherein the maximum thermal treatment time of the substrate is dependent on the capacitance of the capacitor, c) at the end of a desired exposure time of the substrate using the lamp (110) while employing the power supply (280), the electronic switch 2 (170) is closed and at approximately the same time the power supply of the lamp is disconnected from the power supply for continuous operation (280) via the opening of the electronic switch 1 (290), so that a temperature curve similar to the "flash lamp assisted spike annealing" occurs. In this case, the heating always takes place from one side, however, for example, from the front side of the substrate.

Figure 1:
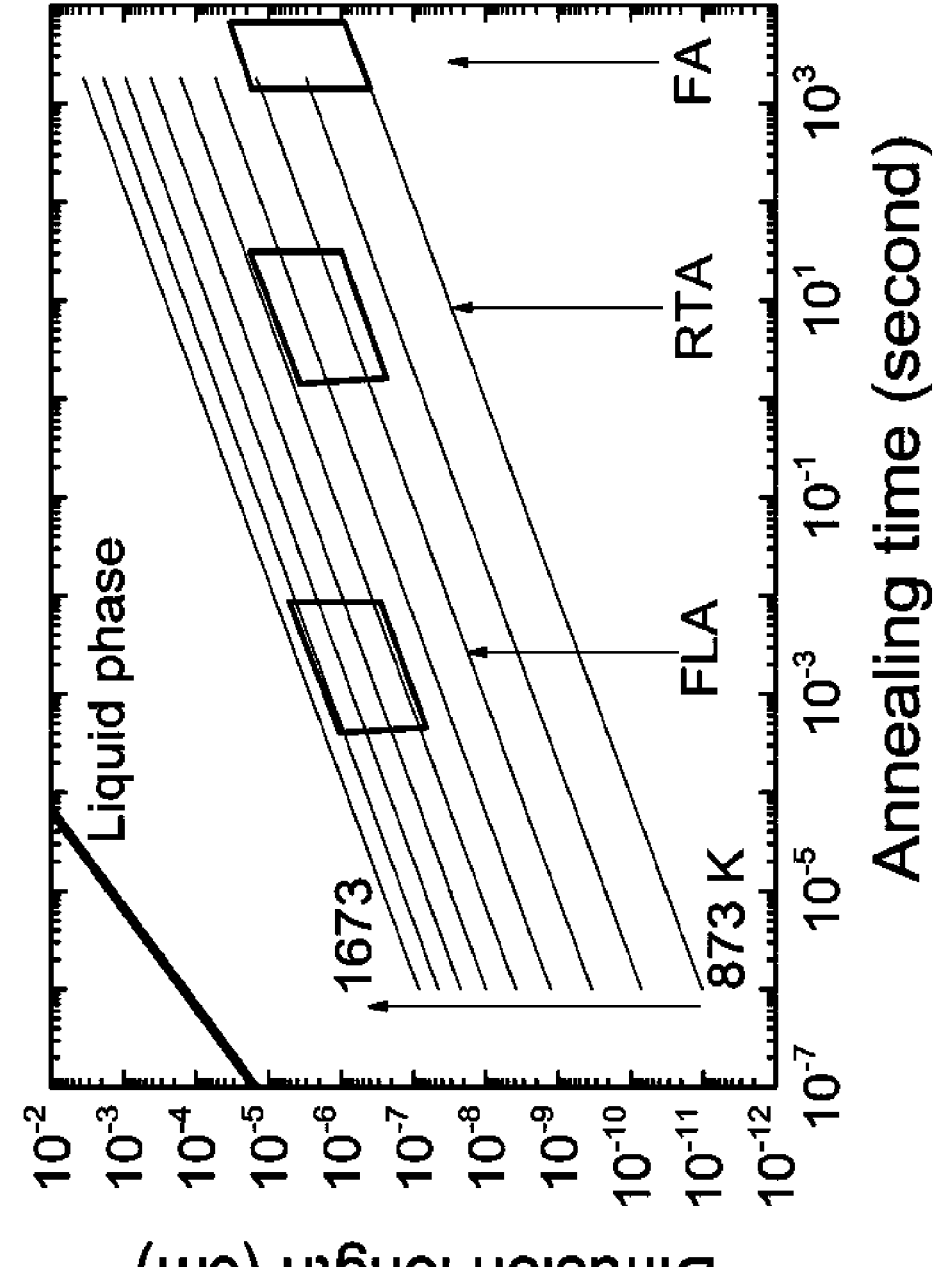
FIG. 1 shows a chronological duration of the thermal treatment of various methods for doping a semiconductor.

The apparatus in FIG. 3 offers additional exposure times in relation to flash lamps and/or halogen lamps or infrared lamps, in the range between FLA and RTP according to FIG. 1, i.e., between approximately 20 ms and approximately 500 ms. Moreover, higher light powers of the lamp (110) can be achieved in comparison to halogen or infrared lamps, also for RTP of typical exposure times. Furthermore, only a single type of lamps is required for the thermal treatment of the substrate in comparison to the "flash lamp assisted spike annealing".

LIST OF REFERENCE NUMERALS

100: apparatus according to the prior art
110: gas discharge lamp
120: capacitor
130: throttle coil
140: power supply for ignition
150: power supply for charging the capacitor
160: power supply for simmer operation
170: electronic switch 2
200: apparatus according to the invention
280: power supply having constant power for continuous operation
290: electronic switch 1

The invention claimed is:

1. A method for thermal treatment of a substrate using at least one gas discharge lamp wherein, in an operating mode, a capacitor previously charged via a power supply is discharged via the at least one gas discharge lamp, wherein the at least one gas discharge lamp is operated for a first period of time having a duration of 20 ms to 5 seconds at a constant electrical power with a power level at least one order of magnitude lower than in the operating mode, and at the end of the first period of time, average electrical power to the gas discharge lamp is increased by at least one order of magnitude for a second period of time having a duration of 50 μs to 20 ms.

2. The method as claimed in claim 1, wherein the thermal treatment of the substrate in the first period of time remains restricted from 20 ms to 5 seconds.

3. The method as claimed in claim 1, wherein the substrate has a coating having a thickness of 2 to 200 μm.

4. The method as claimed in claim 3, wherein the coating comprises at least one sol-gel film, a lacquer, or of nanoparticles.

5. An apparatus for thermal treatment of a substrate using at least one gas discharge lamp, which has a simmer operation in a standby mode and which in an operating mode is connectable to at least one electrically charged capacitor via a first electronic switch, wherein the gas discharge lamp is connectable via a second electronic switch to a power supply of constant power of at least one order of magnitude less than in the operating mode for a duration of 20 milliseconds to 5 seconds.

6. The apparatus as claimed in claim 5, wherein the first power supply includes a stray field transformer and a rectifier.

7. The apparatus as claimed in claim 6, wherein a maximum current strength of the stray field transformer is adapted to be set manually via a mechanical regulator.

8. The apparatus as claimed in claim 5, wherein the first power supply includes at least one rechargeable battery.

* * * * *

UNITED STATES PATENT AND TRADEMARK OFFICE
CERTIFICATE OF CORRECTION

| | |
|---|---|
| PATENT NO. | : 11,490,473 B2 |
| APPLICATION NO. | : 16/309639 |
| DATED | : November 1, 2022 |
| INVENTOR(S) | : Harald Gross |

It is certified that error appears in the above-identified patent and that said Letters Patent is hereby corrected as shown below:

In the Drawings

Figure 2:
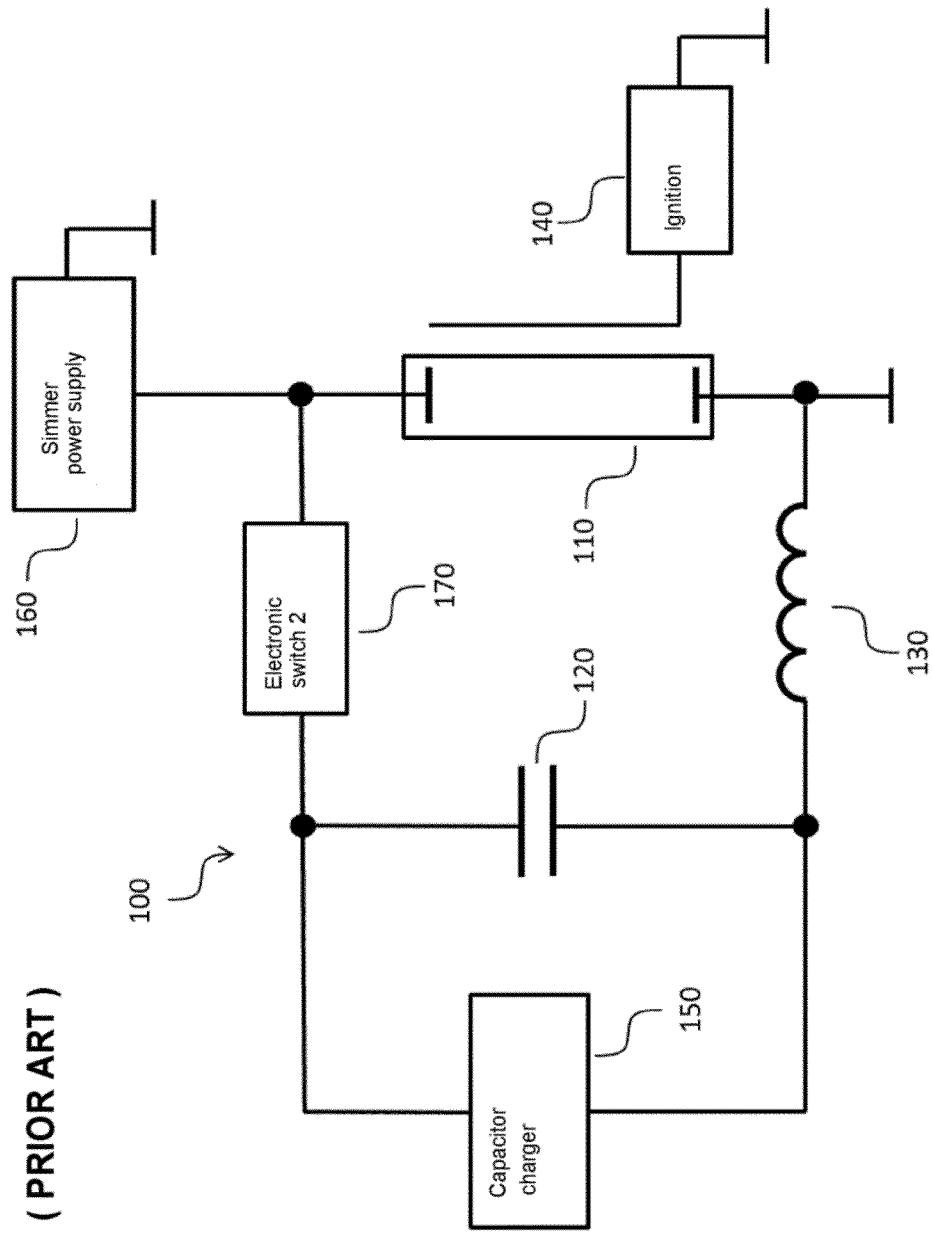
FIG. 2 shows prior art apparatus which is typical for operating flash lamps in production.
Figure 3:
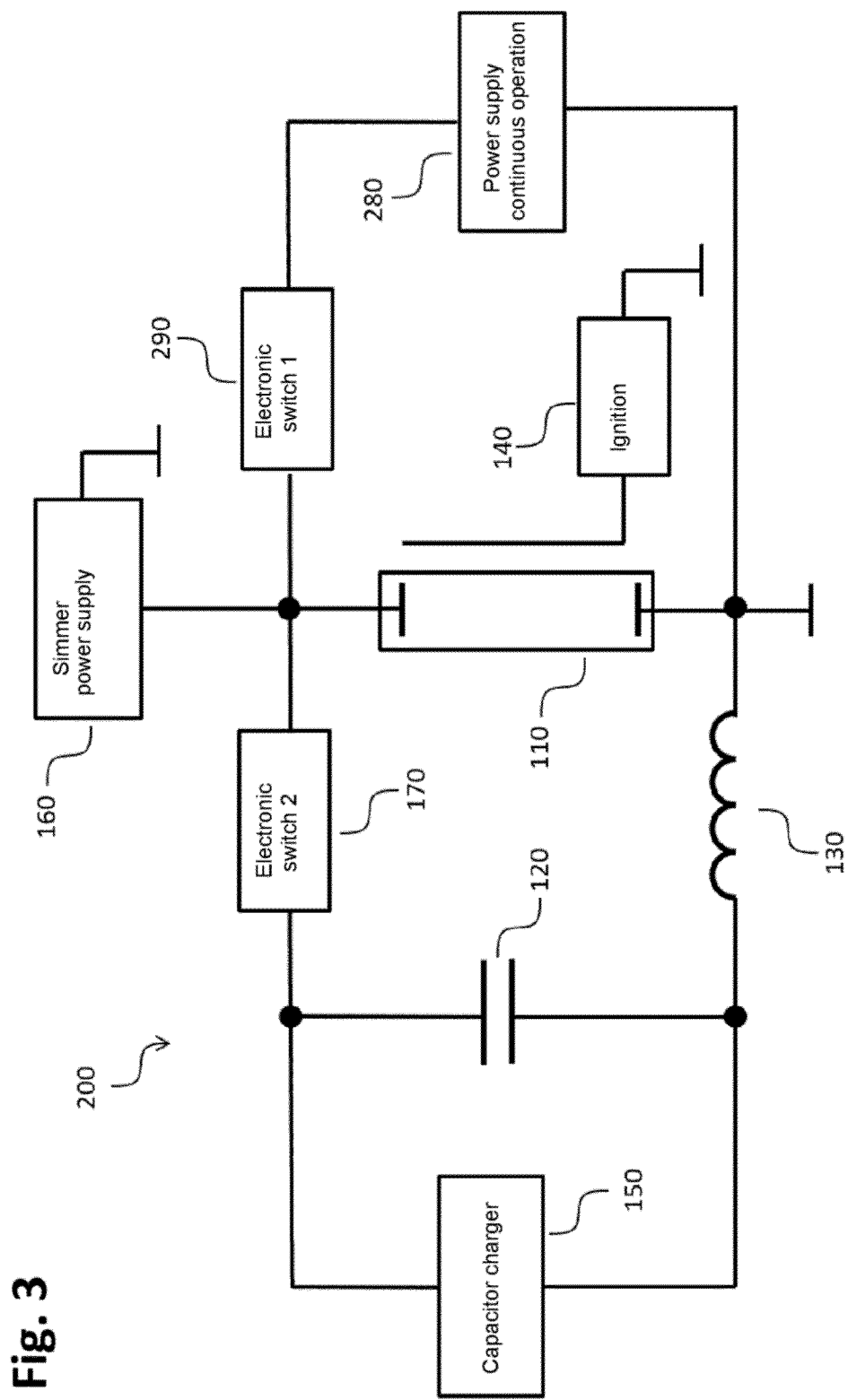

Delete fig. 2, and substitute therefor with the attached drawing sheet, consisting of the corrected fig. 2.

Delete fig. 3, and on the title page, the illustrative print figure, and substitute therefor with the attached drawing sheet, consisting of the corrected fig. 3.

Signed and Sealed this
Third Day of January, 2023

Katherine Kelly Vidal
*Director of the United States Patent and Trademark Office*